United States Patent
Trainor et al.

(10) Patent No.: US 10,128,807 B2
(45) Date of Patent: *Nov. 13, 2018

(54) BAND-BASED AMPLIFIER LINEARITY ADJUSTMENT

(71) Applicant: SiGe Semiconductor, Inc., Ottawa (CA)

(72) Inventors: Alan J. A. Trainor, Bristol (GB); Grant Darcy Poulin, Carp (CA); Craig Joseph Christmas, Irvine, CA (US)

(73) Assignee: SiGe Semiconductor, Inc., Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/423,911

(22) Filed: Feb. 3, 2017

(65) Prior Publication Data
US 2017/0149400 A1  May 25, 2017

Related U.S. Application Data

(60) Division of application No. 14/807,800, filed on Jul. 23, 2015, which is a continuation of application No.
(Continued)

(51) Int. Cl.
*H04B 1/38* (2015.01)
*H03G 3/30* (2006.01)
(Continued)

(52) U.S. Cl.
CPC ......... *H03G 3/3042* (2013.01); *H03F 1/0205* (2013.01); *H03F 1/0261* (2013.01); *H03F 1/56* (2013.01); *H03F 3/19* (2013.01); *H03F 3/21* (2013.01); *H03F 3/24* (2013.01); *H03F 3/3042* (2013.01); *H03G 3/001* (2013.01); *H04W 52/52* (2013.01); *H03F 2200/222* (2013.01); *H03F 2200/318* (2013.01); *H03F 2200/321* (2013.01); *H03F 2200/387* (2013.01); *H03F 2200/408* (2013.01); *H03F 2200/451* (2013.01)

(58) Field of Classification Search
CPC ........ H03F 1/56; H03F 2200/318; H03F 3/19; H03F 3/24; H03F 1/0205; H03F 1/0261; H03F 2200/321; H03F 3/3042; H03G 3/3042; H04W 52/52
See application file for complete search history.

(56) References Cited

U.S. PATENT DOCUMENTS 5,856,749 A   1/1999  Wu
6,002,276 A * 12/1999  Wu .................. H03F 3/303
                                          323/316
(Continued)

*Primary Examiner* — Nhan Le
(74) *Attorney, Agent, or Firm* — Knobbe, Martens, Olson & Bear, LLP

(57) ABSTRACT

A system improve amplifier efficiency of operation relative to that of an amplifier with fixed biasing is operating channel dependent. A control circuit determines a bias current for an amplifying transistor of an amplifier circuit based at least in part on an operating channel. The amplifying transistor operates in a multi-channel system, where the bias current for the amplifying transistor operating at channels at an edge of a channel band is different from the bias current for the amplifying transistor operating at channels nearer a center of the channel band.

20 Claims, 15 Drawing Sheets

Related U.S. Application Data

14/192,721, filed on Feb. 27, 2014, now Pat. No. 9,099,962, which is a division of application No. 13/778,677, filed on Feb. 27, 2013, now Pat. No. 8,706,064, which is a division of application No. 12/549,014, filed on Aug. 27, 2009, now Pat. No. 8,391,812.

(51) Int. Cl.
| | |
|---|---|
| *H03F 1/02* | (2006.01) |
| *H03F 1/56* | (2006.01) |
| *H03F 3/24* | (2006.01) |
| *H03F 3/19* | (2006.01) |
| *H03F 3/30* | (2006.01) |
| *H03F 3/21* | (2006.01) |
| *H03G 3/00* | (2006.01) |
| *H04W 52/52* | (2009.01) |

(56) References Cited

U.S. PATENT DOCUMENTS

| | | | |
|---|---|---|---|
| 6,496,065 B1 * | 12/2002 | Kim | H03F 3/193 330/149 |
| 6,606,483 B1 | 8/2003 | Baker et al. | |
| 6,763,228 B2 | 7/2004 | Prentice et al. | |
| 6,847,262 B2 | 1/2005 | Ichitsubo et al. | |
| 6,873,211 B1 | 3/2005 | Thompson et al. | |
| 7,016,654 B1 | 3/2006 | Bugeja | |
| 7,199,662 B2 * | 4/2007 | Seko | H03F 1/02 330/261 |
| 7,471,154 B2 | 12/2008 | Thompson | |
| 7,751,792 B2 | 7/2010 | Connell et al. | |
| 7,821,362 B2 | 10/2010 | Sheng et al. | |
| 7,848,724 B2 | 12/2010 | Bult et al. | |
| 8,000,737 B2 | 8/2011 | Caimi et al. | |
| 8,130,735 B2 | 3/2012 | Rofougaran | |
| 8,249,573 B2 | 8/2012 | Rofougaran | |
| 8,391,812 B2 * | 3/2013 | Trainor | H03F 1/0261 330/285 |
| 8,675,680 B2 | 3/2014 | Trainor et al. | |
| 8,706,064 B2 | 4/2014 | Trainor et al. | |
| 9,099,962 B2 | 8/2015 | Trainor et al. | |
| 9,692,360 B2 | 6/2017 | Trainor et al. | |
| 2009/0295485 A1 | 12/2009 | Mitchell | |
| 2010/0176875 A1 | 7/2010 | Pulijala | |
| 2014/0176243 A1 | 6/2014 | Trainor et al. | |

* cited by examiner

BAND-BASED AMPLIFIER LINEARITY ADJUSTMENT

INCORPORATION BY REFERENCE TO RELATED APPLICATIONS

Any and all priority claims identified in the Application Data Sheet, or any correction thereto, are hereby incorporated by reference under 37 CFR 1.57.

BACKGROUND

The invention relates generally to RF amplifiers and more particularly to an amplifier and method having a dynamically adjustable bias for improving amplifier efficiency.

Traditionally, a semiconductor RF signal power amplifier (PA) is biased with VCC voltage or VDD voltage along with base or gate voltage to establish an operating point for an amplifying transistor or transistor array. In the context of a bipolar transistor, the base voltage or current is established using a bias circuit that is designed to supply a bias point. As is well known in the art, the bias point determines many of the amplifying characteristics of the transistor. In fact, classification of amplifiers into class A, class B, class AB, etc. is primarily determined by the bias point.

Power amplifiers, particularly those based on semiconductor transistors, usually comprise one or more stages of amplification. For example, a first stage of amplification might receive a native RF signal and amplify that signal to a level suitable for a second stage. Typically, three stages of amplification are used in an amplifier suitable for 802.11a, 802.11b, 802.11g, 802.16e, and other wireless standards in order to provide 25 to 35 dB of gain. Great care is taken to set the operating point for each stage of amplification—for each transistor in the chain—such that an optimum gain and linearity are established for each stage, and the complete PA operates in a harmonious manner. For example, the first stage could provide 10 dB of gain, the second stage is biased to provide only 5 dB of gain, and a third and final stage provides 15 dB of gain resulting in a 30 dB amplifier. In addition to an operating point for each transistor in the amplification chain, the matching circuit between transistor amplification stages is designed and manufactured such that an efficient transfer of signal power is supported from stage to stage.

Adjustment of the bias point is a mechanism for amplifier control. In prior art circuits, adjustable bias circuits are provided to allow for circuit tuning—correction of bias current variability caused, for example, by manufacturing inaccuracies. It is well appreciated in the art of amplifier design, that through the operating point, the amplifying qualities of the semiconductor transistor are adjustable such that more or less gain is provided, more or less distortion is manifested, or quite simply more or less current consumption occurs at the operating point. Thus, even within the strict tolerances of semiconductor manufacturing, small post production tuning of a fixed bias may result in significant improvement of the amplifier operation.

Adjustment of the interstage matching circuit is another mechanism for amplifier control. In fact, the matching circuit following the output port of the final stage of amplification is very important in that it matches an output signal from the amplifier to an antenna or load. A mechanism to control the matching circuit at the output port may permit matching for variations in load and protection of semiconductor transistors from large mismatch effects. Thus, for example, external matching circuits as manifested using the placement of L, R, and C components on a printed circuit board are often used to ensure accurate impedance matching between an amplifier and a load.

The operating point and matching circuit deterministically result in a PA providing an amplified RF signal with certain qualities. For example in typical applications, an amount of distortion and power level are two qualities that must be compliant with certain standards established by governmental regulators and/or interoperability committees which have the mandate to certify products as compliant. For example, the IEEE 802.11g standard requires certain qualities in respect of the spectral output of the RF transmission system (Mask) such that signal energy in certain bands is below both relative and absolute threshold values. Moreover, users of such transmission systems are expecting signal clarity resulting from a low probability of transmission error and a low packet error rate. In this respect, error vector magnitude (EVM) as a percentage is used as a figure of merit for signal clarity. For example, a 3% EVM specification might be expected or required from the transmission system in order to achieve a requisite de minimis packet rate. Both compliance with the Mask and EVM are determined by the RF signal quality at an output port of the amplifier, which in turn is determined by the operating point, matching circuit and other settings. Thus, during manufacture or assembly, the EVM is determinable and those tunable portions of the circuit are adjusted to provide a desired EVM and then fixed for the circuit to ensure EVM compliance.

Moreover, it should also be understood that the Mask might vary from jurisdiction to jurisdiction. For example, Mask requirements in Japan are different from those in Europe or North America. Even allowable in-band power output levels might be different in each jurisdiction and expectations in respect of EVM also vary from user to user of the transmission system. A universal goal however, exists from user to user and from jurisdiction to jurisdiction—that is, low power consumption and high power efficiency. Low power consumption will provide the user of a portable transmission device, such as a cell phone, with a long period of usage between charging times. High power efficiency provides the user with less waste of operating energy in the transmission device—getting the most out of the available battery energy. Such waste often manifests as heat generation, which must be dealt with and dissipated. Clearly, using battery power in a wasteful manner is not conducive to long 'talk time' in the context of a portable transmission device and generating excess heat is not conducive to comfort if, for example, a battery operated device were to heat up.

A well known trade-off between linear performance (low EVM and compliance with Mask) in an amplifier and power consumption exists. An amplifier can be biased such that it provides very linear amplification performance (low signal distortion) but only at the cost of high power consumption. Therefore, by knowing in advance the linearity requirements, a designer can approximately optimize power consumption to provide just enough linear performance whilst minimizing power consumption.

Traditionally, the operating point and the interstage matching circuits are established and fixed by design. Clearly, if the operating point for each transistor amplifier is fixed at the time of manufacture then an operating point that provides for the most stringent requirements is fixed and the transmission system has no flexibility to adjust bias or match in the context of a varying linearity or power output requirement. Since many country markets (also known as operating jurisdictions) have different requirements, either some of those operating jurisdictions are serviced with devices have less efficient battery usage than is possible or use devices that are customized for those markets. This is clearly less than ideal and it would be efficient to be able to manufacture devices that are capable of serving more than one operational jurisdiction whilst being compliant with the different requirements of that jurisdiction.

In the context of wireless LAN (WLAN) Power Amplifiers (PAs) operating under one of the IEEE 802.11 standards, PAs are typically biased and optimized for best EVM performance at a specified output power. Moreover, the transmit power level for higher modulation rates may be EVM limited depending upon the PA design. As modulation rates are decreased, transmit power can be increased until Mask or Band Edge performance limits the transmit power.

In addition, WLAN PAs are typically designed for class AB operation with fixed bias currents for each individual amplifier stage. Some applications permit the reduction of transmit power to reduce DC power consumption and improve battery life for portable applications. However, simply reducing the transmit power level is inefficient. For example, if the specified performance of the power amplifier is 3% EVM at 20 dBm output power, then backing off the transmit power to 1 OdBm will result in very good EVM and Mask performance but at much reduced efficiency because the amplifier is biased to provide a much higher level of linear output power. In contrast, reducing the bias at lower transmit power will drastically improve efficiency and greatly improve battery life.

In AGC design it has been proposed in U.S. Pat. No. 6,763,228 to use a feedback system for controlling bias. The system aims to achieve automatic gain control through bias control, which is achievable since it is known to use bias to control amplifier gain. In U.S. Pat. No. 6,873,211, bias is used to switch an amplifier between a linear mode of operation and a saturated mode of operation. Each of these bias control methods addresses an issue relating to controlling amplification of the amplifier—the bias is changed to control the amplifier's gain—and is controlled in dependence upon gain characteristics of the amplifier.

Further, for RF PAs operating in the range of 2.4 to 10 GHz, digital control is not typically used. These PAs are often based on semiconductor technology platforms such as the Gallium Arsenide (GaAs) compound, which do not feature complementary logic devices and, as such, do not receive or logically manipulate digital signals. In fact, when control signals are required, GaAs PAs work with analog control signals. Further, these same PAs are precluded from working with digital signals especially at lower voltages (e.g. 2.5V, 1.8, I.2V logic).

It would be advantageous to provide an amplifier and method for improving battery life by improving amplifier efficiency in the context of a variety of operational jurisdictions while maintaining other operating characteristics of said amplifier.

SUMMARY

In accordance with the invention there is provided a method comprising: providing a power level indicating a level of transmission power from an amplifier; providing at least an indication of at least one of channel, channel bandwidth, OOB spectral requirements, spectral mask requirements, EVM, modulation rate, and modulation type; and, providing at least a control signal for controlling one of a bias current provided to the amplifier and a matching circuit for matching an output port of at least a stage of the amplifier, the control signal determined in dependence upon the power level and the at least an indication; and, adjusting the one of the bias current and the matching circuit in accordance with the control signal.

In accordance with another embodiment of the invention there is provided an amplifier circuit comprising: an amplifying transistor for receiving an input RF signal and for providing an output amplified RF signal, the amplifying transistor for receiving a bias current; and, a control circuit for determining a first bias current for the amplifying transistor and for providing a control signal in dependence thereon, the first bias current determined in dependence upon an error vector magnitude (EVM) target and an operating point of the amplifier circuit, the first bias current determined for improving the overall amplifier efficiency of operation relative to an amplifier with a fixed bias current.

In accordance with another embodiment of the invention there is provided an amplifier circuit comprising: an amplifying transistor for receiving an input RF signal and for providing an output amplified RF signal, the amplifying transistor for receiving a bias current; and, a control circuit for determining a first matching condition for the amplifying transistor and for providing a control signal in dependence thereon, the first matching condition determined in dependence upon an error vector magnitude (EVM) target and an operating point of the amplifier circuit, the first matching condition determined for improving the overall amplifier efficiency of operation relative to an amplifier with a fixed matching condition.

In accordance with another embodiment of the invention there is provided an amplifier circuit comprising: an amplifying transistor for receiving an input RF signal at a frequency above 2 GHz and for providing an output amplified RF signal, the amplifying transistor for receiving a bias current; and, a control circuit for determining one of a first bias and a first matching condition for the amplifying transistor and for providing a digital control signal in dependence thereon, the one of a first bias and a first matching condition determined in dependence upon other than merely a linearity of gain of the amplifier and an operating point of the amplifier circuit, the one of a first bias and a first matching condition determined for improving the overall amplifier efficiency of operation relative to an amplifier with a fixed one of a first bias and a first matching condition.

In accordance with another embodiment of the invention there is provided a method comprising: providing a power level for transmission from an amplifier of a mobile device; providing at least an indication of a standard within which the amplifier is to operate, the standard different for different locations of operation of the mobile device; and, providing at least a control signal for controlling one of a bias current provided to the amplifier and a matching circuit for matching an output port of at least a stage of the amplifier, the control signal determined in dependence upon the at least an indication of a standard and for improving operating efficiency of the mobile device for the standard relative to operating efficiency of the mobile device across the different locations; and, adjusting the one of the bias current and the matching circuit in accordance with the control signal.

BRIEF DESCRIPTION OF THE DRAWINGS

Exemplary embodiments of the invention will now be described in conjunction with the following drawings, in which:

FIG. 12b is a simplified block diagram of an amplifier for use with the method of FIG. 12a.

DETAILED DESCRIPTION

Figure 1A:
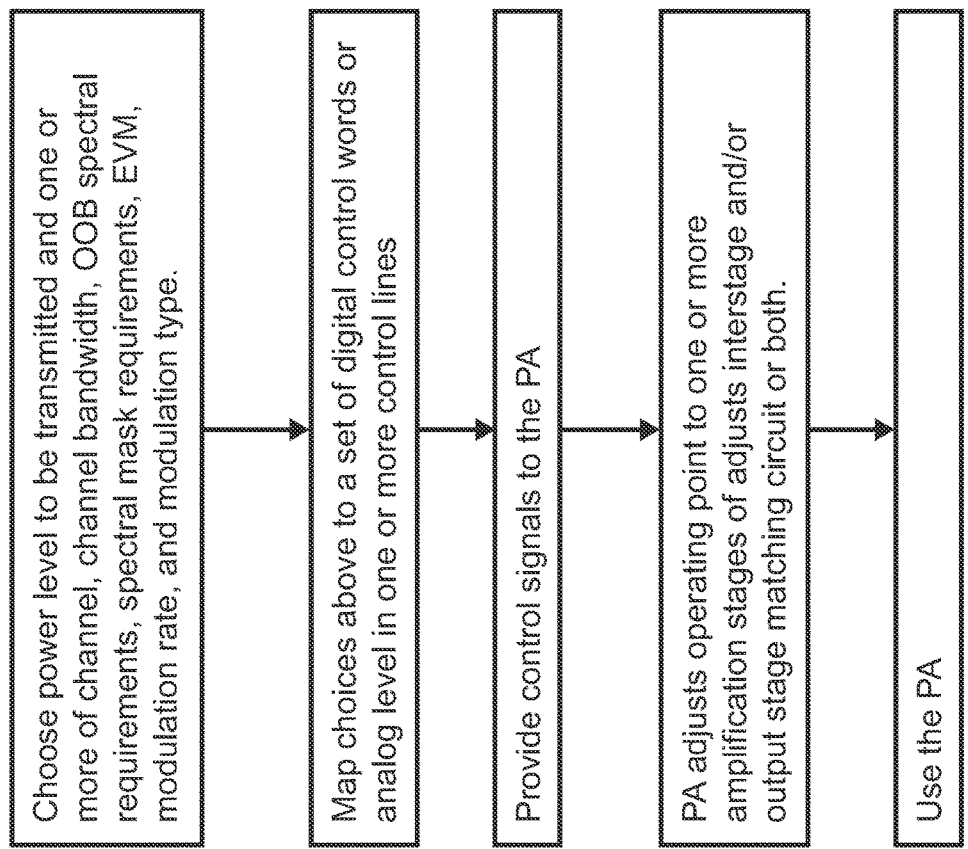
FIG. 1a is a simplified flow diagram of a method according to an embodiment of the invention.

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

In Table 1, System EVM requirements are shown for different modulation rates. As is evident, different modulation schemes and rates have very different EVM requirements and designing to meet these requirements often requires a design that meets the most demanding of the requirements. Often, this limits the power consumption advantages of using other modulation schemes or rates since the system is less efficient when operating at modulation schemes and rates other than that having the most demanding requirements. Hereinafter, modulation schemes or rates for which some standard has defined demanding EVM requirements will be referred to as demanding modulation schemes or rates. Of course, designing the system to be more efficient with less demanding modulation schemes or rates is also ineffective because (a) it only aggravates the drawbacks to the more demanding modulation schemes and (b) often it results in the failure to meet specification requirements for those more demanding modulation schemes or rates. For example, a PA may be designed with a very high linearity performance with a view to the requirement of a data rate equal to 54 Mbps. Operating such a PA at lower data rates would normally be wasteful of the power consumption if the bias point could not be adjusted to a less linear regime of operation for the PA.

TABLE 1

| 802.11 g System EVM requirements | | | |
|---|---|---|---|
| Modulation | Rate (Mbps) | EVM (dB) | EVM (%) |
| BPSK | 6 | −5 | 56.2% |
| BPSK | 9 | −8 | 39.8% |
| QPSK | 12 | −10 | 31.6% |
| QPSK | 18 | −13 | 22.4% |
| 16-QAM | 24 | −16 | 15.8% |
| 16-QAM | 36 | −19 | 11.2% |
| 64-QAM | 48 | −22 | 7.9% |
| 64-QAM | 54 | −25 | 5.6% |

A PA with fixed bias points and fixed interstage/output port match has a fixed power consumption, heat dissipation, and linearity performance on all channels, regardless of actual requirements or use. In the context of multi-mode operation, such a PA cannot adjust the operating point or matching circuits to decrease or increase linear performance as required by the mask requirements, EVM requirements, or jurisdiction-dependent operating specifications.

A PA's operating efficiency is beneficially enhanceable by approximately optimizing a trade-off between the PA's efficiency and linearity by a set-up of its operating point and matching circuit based on the de minimis mask and EVM requirements for the modulation scheme and rate of a channel that is to be used in a multi-channel OFDM system. Such an approach maintains the specified EVM performance but reduces power consumption. Controlling the PA's bias provides a straightforward method for approximately optimizing performance as the modulation rate, maximum allowed power level, or in-band channel is changed.

Figure 1B:
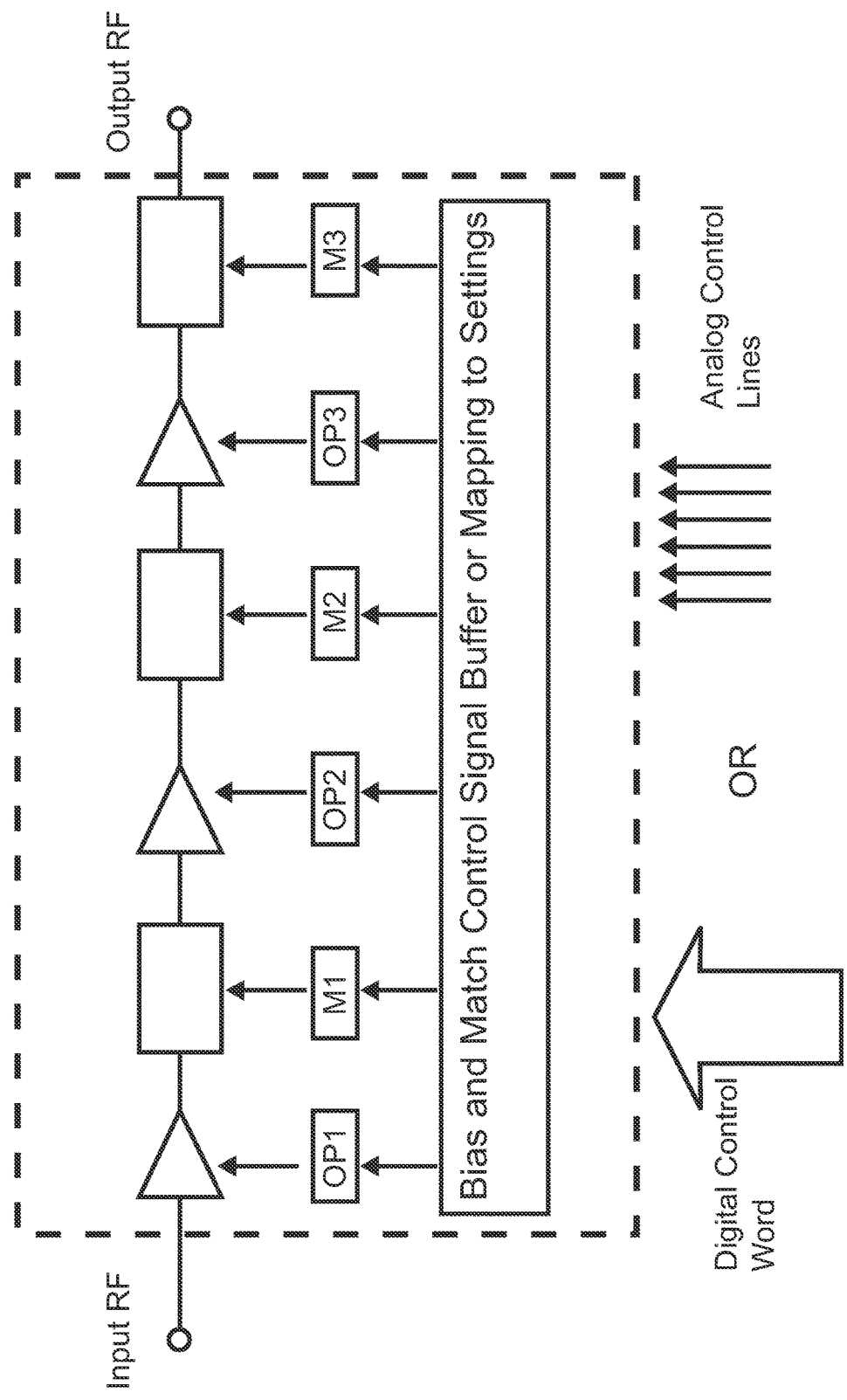
FIG. 1b is a simplified block diagram of an amplifier circuit according to an embodiment of the invention.

In a broad embodiment, in accordance with system requirements or user demand, a baseband processor determines one or more of EVM, mask, channel to be used, maximum allowable power output level, modulation type, and data rate associated with the RF output signal to be transmitted. The baseband processor then maps this information onto a digital control instruction for the PA. The PA then adjusts, in a predetermined manner, the operating point for one or more amplification stages and/or the matching circuit adjustments for one or more of the interstage/output match circuits. The resulting operating point and matching circuit configuration is one that represents a better trade-off in efficiency whilst meeting the requirements of the system effectively. Some possible requirements include EVM, mask, channel to be used, channel bandwidth, maximum allowable power output level, modulation type, and data rate at a maximum of PA efficiency. Of course, only those requirements specified or deemed essential need be considered. Of note, in some systems fewer or more requirements are specified. This method is illustrated in FIG. 1a for the apparatus of FIG. 1b.

Alternatively, analogue control signals are used, for example, a control signal is provided for each controllable aspect of the amplifier operation.

Alternatively, the information on EVM, mask, channel to be used, maximum allowable power output level, modulation type, and data rate is provided to the PA and the mapping to the appropriate operating point for one or more amplification stages and/or matching circuit adjustments for one or more of the interstage/output match circuits is determined and controlled internally to the integrated PA circuit. In either case, PA efficiency is improvable even in consideration of many operating factors and requirements.

For example, according to an embodiment with a multi-carrier OFDM modulation, the operating point of the amplifying transistors and/or the interstage matching circuit is adjusted for lower or higher power efficiency in a circumstance where:

the channel selected to be employed in a transmission system is close to a band edge. For example, in the US, the 2.4 GHz WLAN band ranges from 2400-2483.5 MHz. Typical operating channels include channel 1 (2412 MHz), 6 (2437 MHz), and 11 (2462 MHz). The FCC has defined so-called restricted bands of operation where emissions must be lower than a predefined limit to protect devices operating in these bands. For example, there is a restricted band from 2300-2390 MHz, and another from 2483.5 MHz to 2500 MHz. These restricted bands form a band-edge, and put strict limits on how much power can be radiated into these bands. If the PA is operating on channel 1 or 11, it is obvious that the restricted band is quite close to the operating frequency of the PA (22 MHz below channel 1, and 21.5 MHz above channel 11). However, if the PA is operating in channel 6, the restricted band is now greater than 45 MHz away. Out-of-band emissions from a power amplifier are directly related to PA linearity, so a PA operating in channels 1 or 11 is often required to be more linear than one operating in channel 6. Thus, changing the biasing and/or matching characteristics of the amplifier when operating in channel 1 or 11 is advantageous because efficiency is improvable for a relatively common situation.

a data rate to be employed is lower or higher and correspondingly requires less or more linear performance from the PA, the type of modulation to be employed requires a less or more linear performance from the PA (e.g. QPSK, BPSK, QAM 16, etc.)

the jurisdiction in which the PA is to be compliant requires more or less linear power output from the PA to meet its standards, an evaluation of mask compliance and EVM performance indicates that an increase or decrease in linear performance or power level is required, and the channel bandwidth is variable and therefore requires more or less linear performance from the PA.

For many WLAN applications, currents can be reduced by 25%. Further enhancements in WLAN applications occur at or near the band edge where bias is approximately optimized to increase transmit power. Further, for lower data rates, less current is required and, as such, when lower data rate transmission is used power savings are supported. It is advantageous to adjust the bias current in a fashion that does not prevent meeting of other requirements of the system such as EVM Of course, in today's world of international travel and business, often a single mobile communication device is intended to operate in many countries. As such, the ability to meet performance characteristics in different jurisdictions efficiently is highly advantageous. Similarly, the other situations also present advantages to enhancing efficiency of operation when possible.

Preferably, power consumption is approximately minimized in a PA by adjusting of one or more operating points in amplification stages of the PA. Alternatively or in conjunction therewith, the matching circuits of the PA are adjusted. Such a method is useful for balancing different requirements. For example, it supports minimum simultaneous requirements of power output, absolute and relative spectral output outside an allowed frequency bands (mask), and EVM. In particular, in the context of an EVM limited transmission system, if the modulation rate is reduced, the power consumption is reducible using an adjustment in the operating point and optionally an adjustment in the matching circuits to reduce the level of back-off while still meeting mask requirements and the EVM requirement. In other cases, competing requirements are balanced using dynamic alterations to the amplifier circuit as taught hereinabove.

Figure 2A:
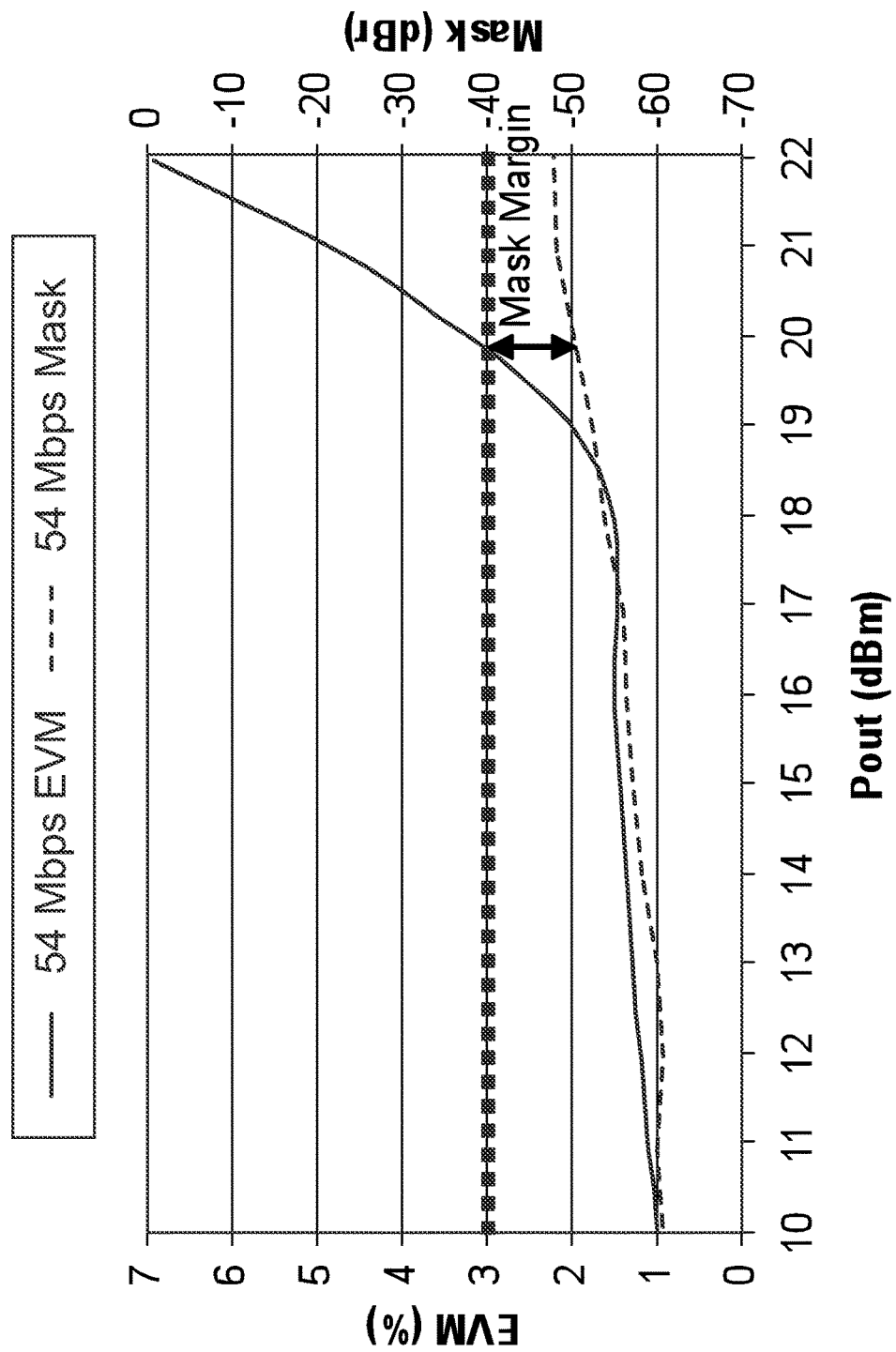
FIG. 2a is a graphical representation of EVM and Mask Limit vs. Pout.

In a more specific embodiment, an extremely critical performance metric of a WLAN Power Amplifier is EVM performance. To meet System EVM performance requirements, power amplifiers are typically specified to 3% EVM performance from the PA at the rated transmit power. This specification leaves some margin for the total system EVM. Referring to FIG. 2a, a diagram of EVM (%) vs. $P_{out}$(dBm) is shown. As is evident from the graph, the EVM of 3% as discussed herein is a horizontal dashed line but the mask is only an approximation thereof several dB below the threshold to provide additional margin. At low $P_{out}$, the margin is approximately 20 dB whereas as $P_{out}$ increases, the margin shrinks to about 6 dB. Because of the high peak to average power of OFDM modulation, power amplifier power is reduced significantly from the 1 dB compression point to meet the 3% EVM requirement. As noted hereinabove, reducing the PA output power results in poor PA efficiency when the PA is actually operated at the lower power level. In fact, Mask compliance at the 3% EVM level has several dB of margin, which makes the system "EVM limited" as seen in FIG. 2a where the threshold of 3% EVM is crossed by the 54 Mbps EVM curve much before the Mask (spectral energy) threshold with increasing power output level ($P_{out}$). Though lower modulation rates reduce the EVM requirement and therefore support a lower bias setting which improves efficiency and extends product battery life, these are not always available or used.

Figure 2B:
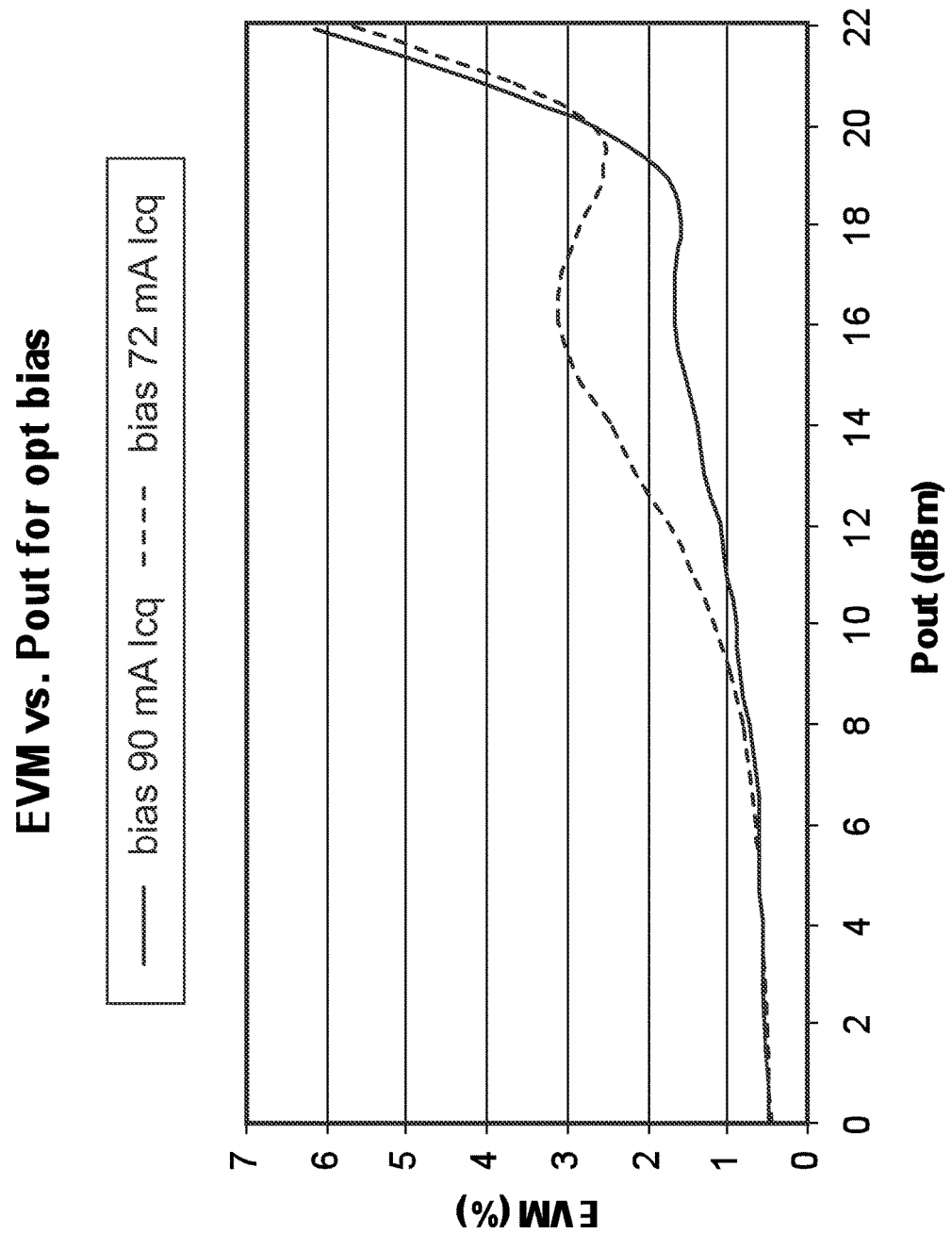
FIG. 2b is a graphical representation of EVM vs. power output at two different bias points.
Figure 3:
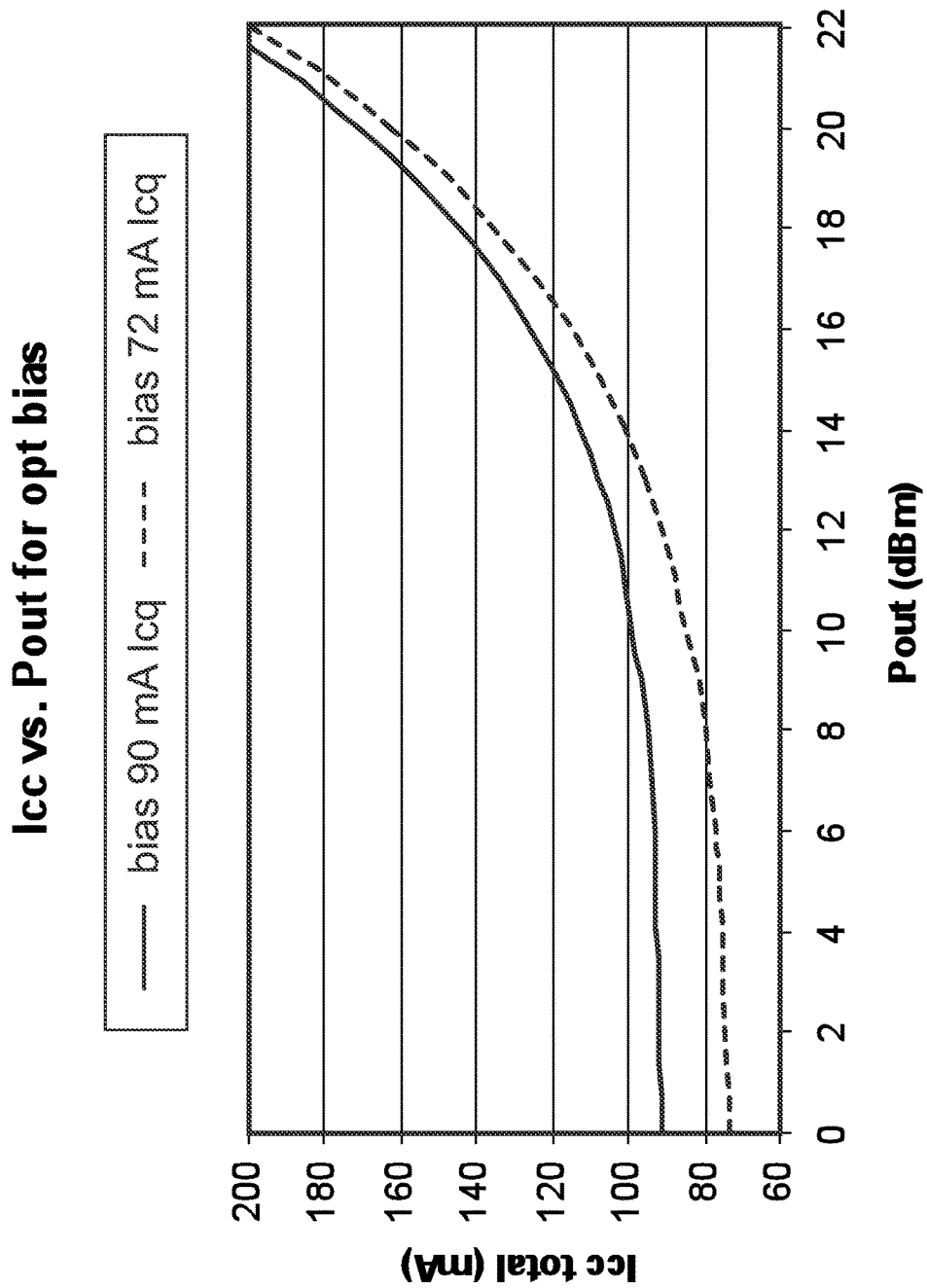
FIG. 3 is a graphical representation of total current vs. power output.

When optimizing EVM performance, particular care is given to biasing a circuit for efficiency of operation at the EVM performance. Consideration of EVM at lower power levels or "backed off" EVM performance is taken into consideration to not exceed a given specification. Typically, lower bias results in increased backed-off EVM, commonly referred to as EVM "humping." This is illustrated in FIG. 2b where EVM at a lower bias point crosses the 3% threshold briefly at approximately 16 dBm power output and then the EVM crosses the threshold again at 20 dBm. This lower power operating point correspondingly results, in a lower ICC consumption (power consumption) over the full range of output powers (see FIG. 3). As such, it is desirable, but problematic.

Figure 4:
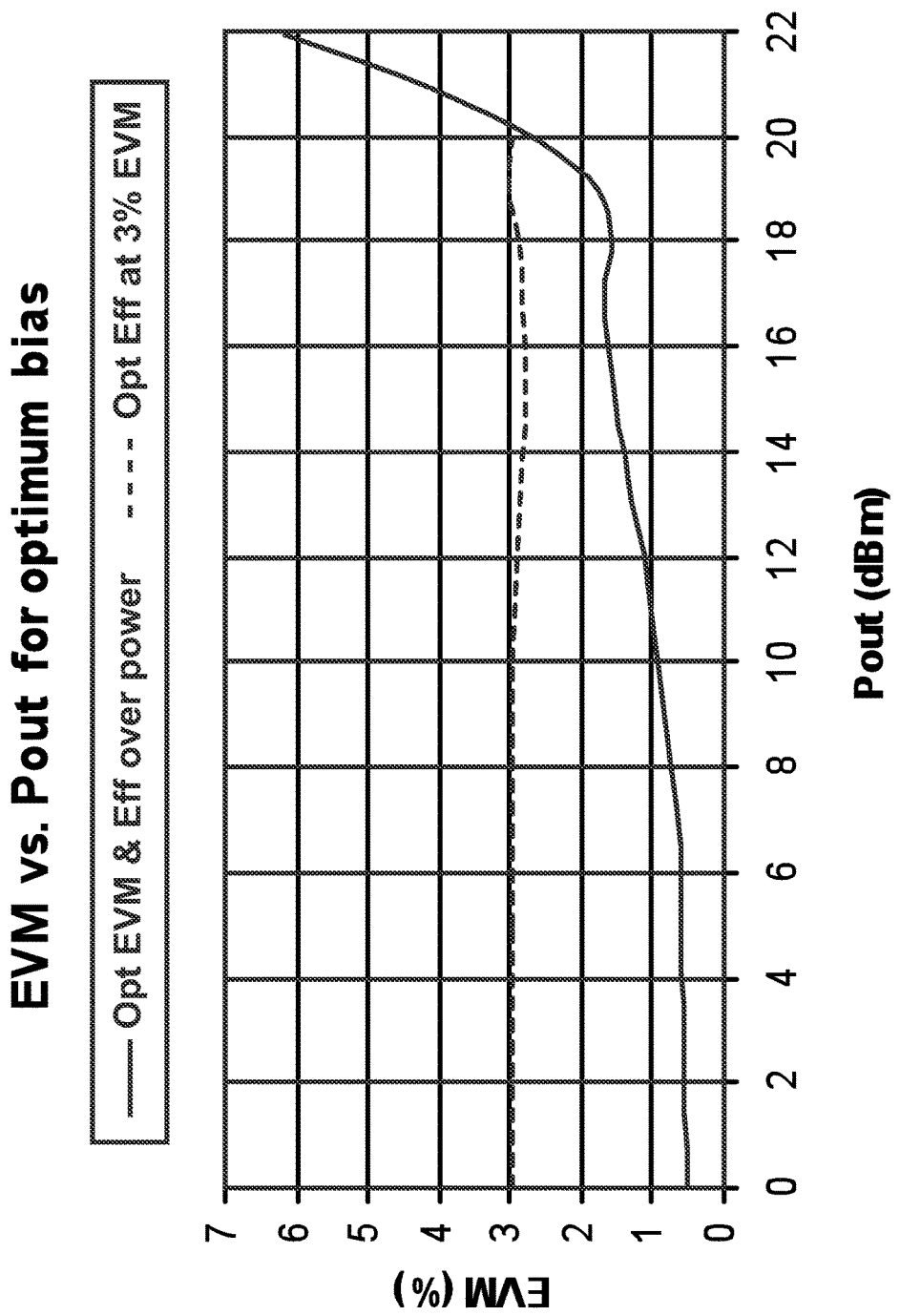
FIG. 4 is a graphical representation of Digital Bias Optimized for 3% EVM.
Figure 5:
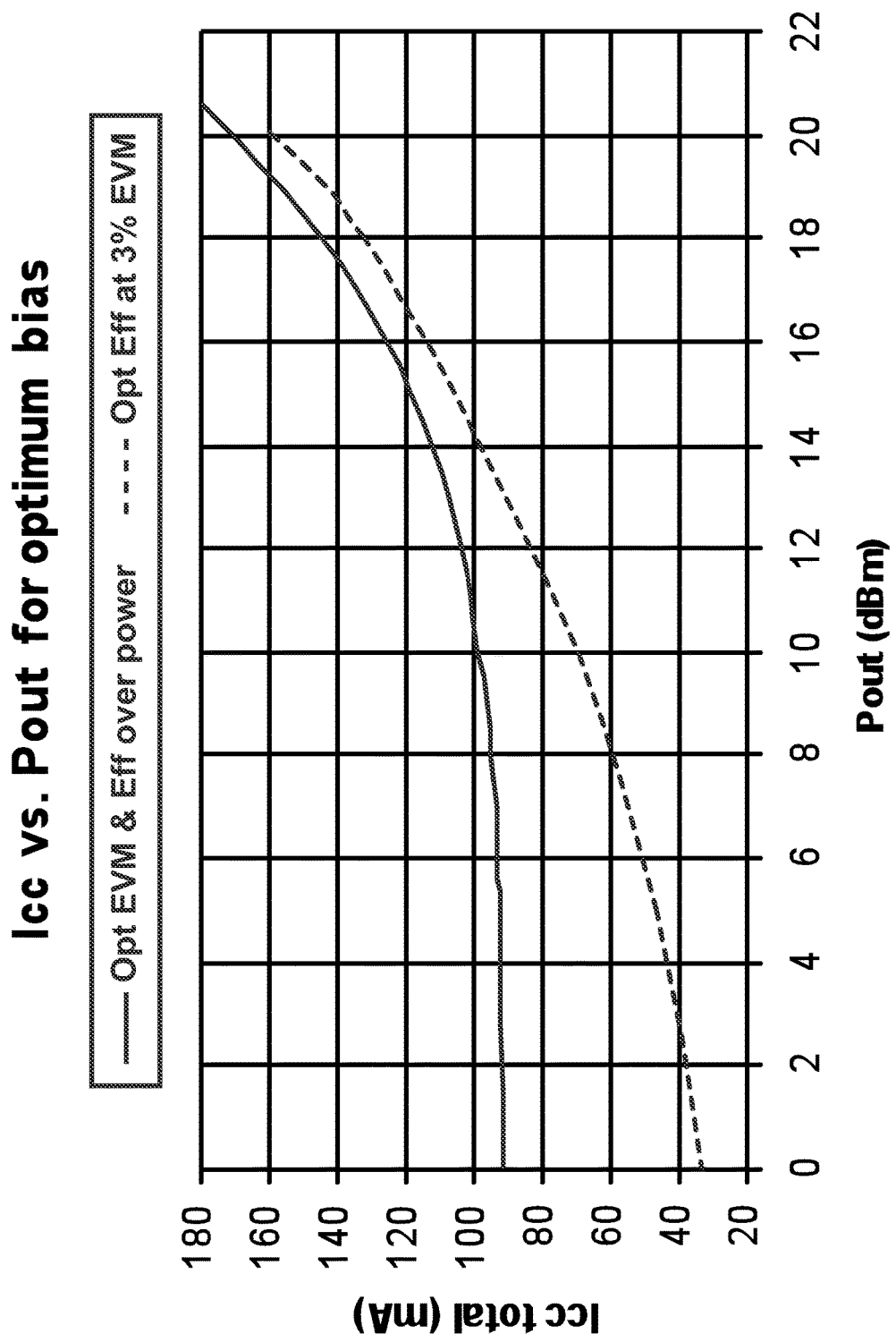
FIG. 5 is a graphical representation of Current Drain for Optimized 3% EVM.

According to an embodiment of the invention, bias at each power level is adjusted to approximately optimize EVM and efficiency for better performance. This results in a dramatic improvement in overall PA performance. FIGS. 4 and 5 show the approximately optimized performance of a PA with digital bias control set for EVM and efficiency. There is a substantial improvement in current drain by dynamically controlling bias at each power level to meet the EVM requirements with a minimum current consumption performance. Advantageously, such a system reduces the overall power consumption, thereby increasing battery life, while maintaining other performance characteristics of the PA.

Figure 6:
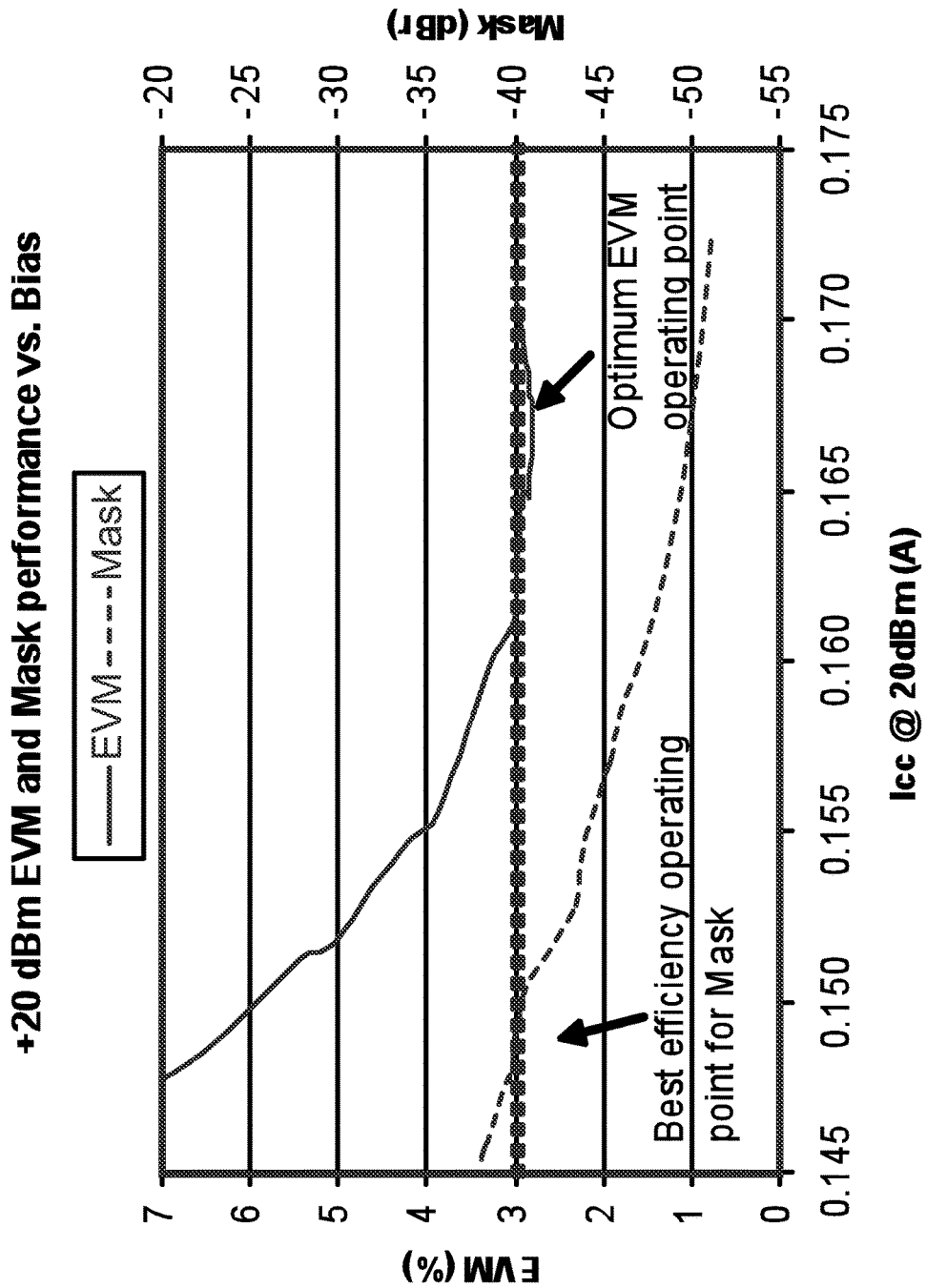
FIG. 6 is a graphical representation of Efficiency optimized for Spectral Mask.

Some applications allow for higher transmit power levels at lower modulation rates, where the performance is mask limited instead of EVM limited. Dynamic bias control allows for further increasing transmit power or improving efficiency by approximately re-optimizing power amplifier bias for approximately optimum spectral mask performance. Referring to FIG. 6, shown is an EVM vs. bias current graph wherein efficiency of operation is determinable. As is evident from the graph, the bias current is reduceable from 170 to 150 mA, improving the efficiency from 17% to 20%. By dynamically adjusting operating points in response to operation of the PA, efficiency is improved while maintaining performance within requirements.

Band edge requirements are taken from the FCC restricted band limits, outlined in the FCC Part 15.205 specification, along with the radiated emission limits defined in FCC Part 15.209. Meeting the FCC Band Edge requirements typically requires setting lower transmit power levels at channels 1 and 11 (2412 MHz and 2462 MHz). Typically, power at the band edge channels—1 and 11—is 3 to 4 dB lower than that of channels that are not band edge limited. As noted above, this results in reduced efficiency of operation.

Figure 7:
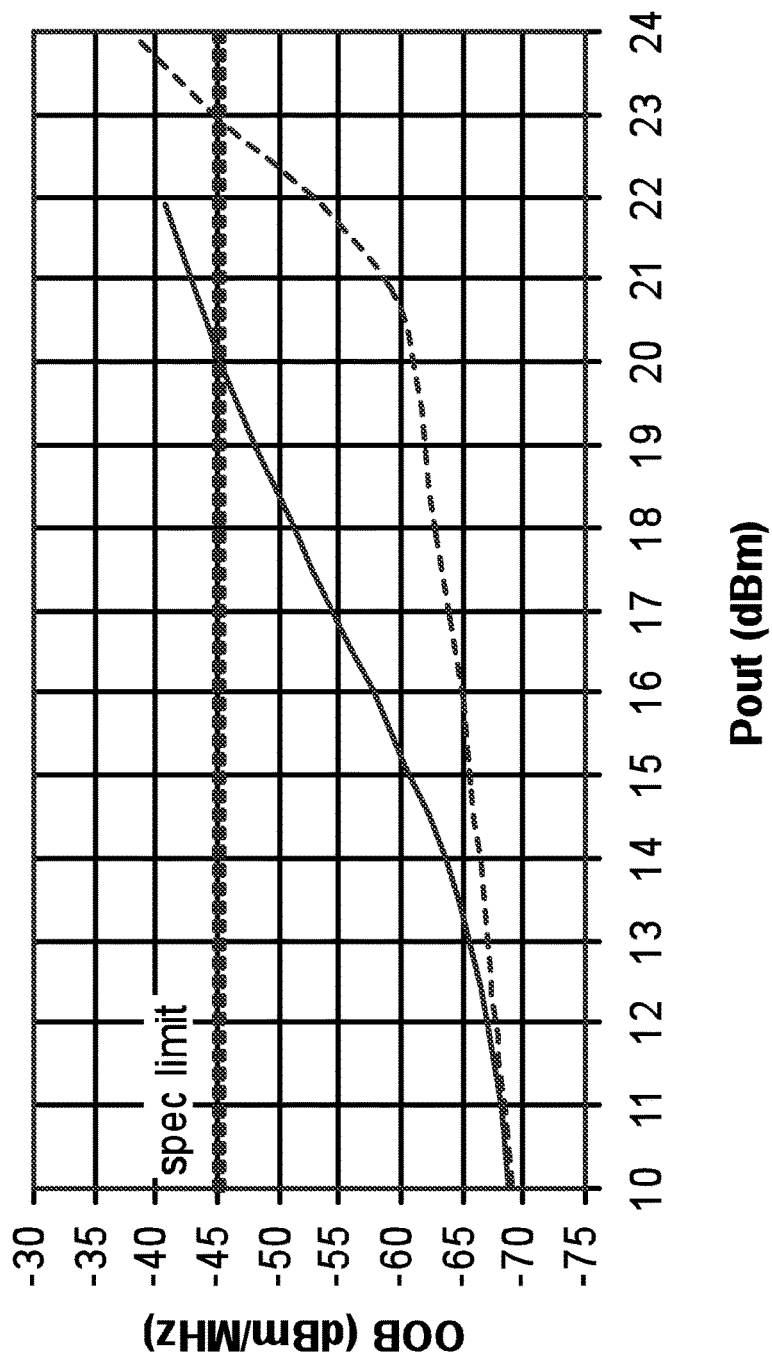
FIG. 7 is a graphical representation of 802.11b 1 Mbps OOB performance.
Figure 8:
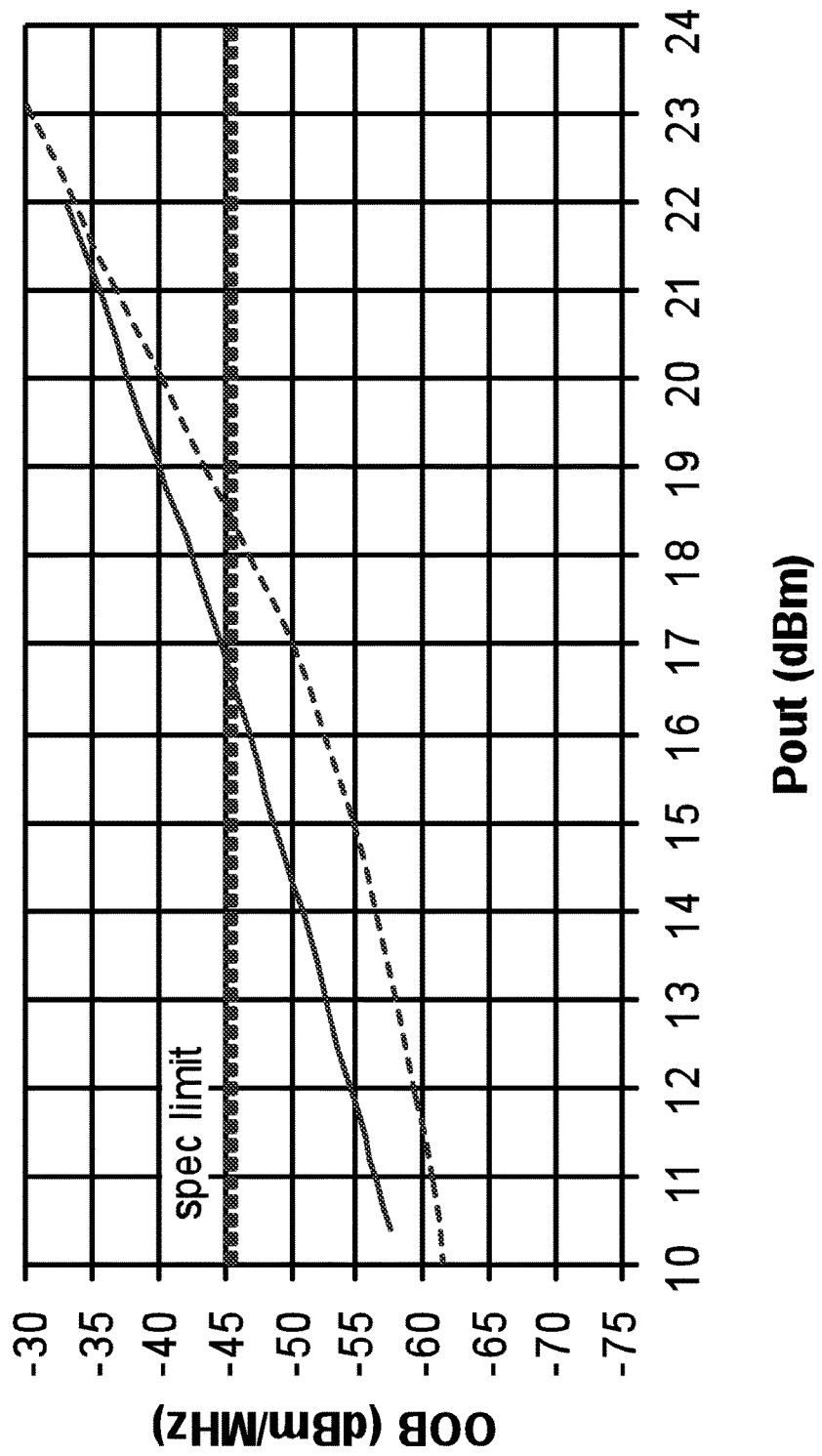
FIG. 8 is a graphical representation of 802.11g 54 Mbps OOB performance.
Figure 9:
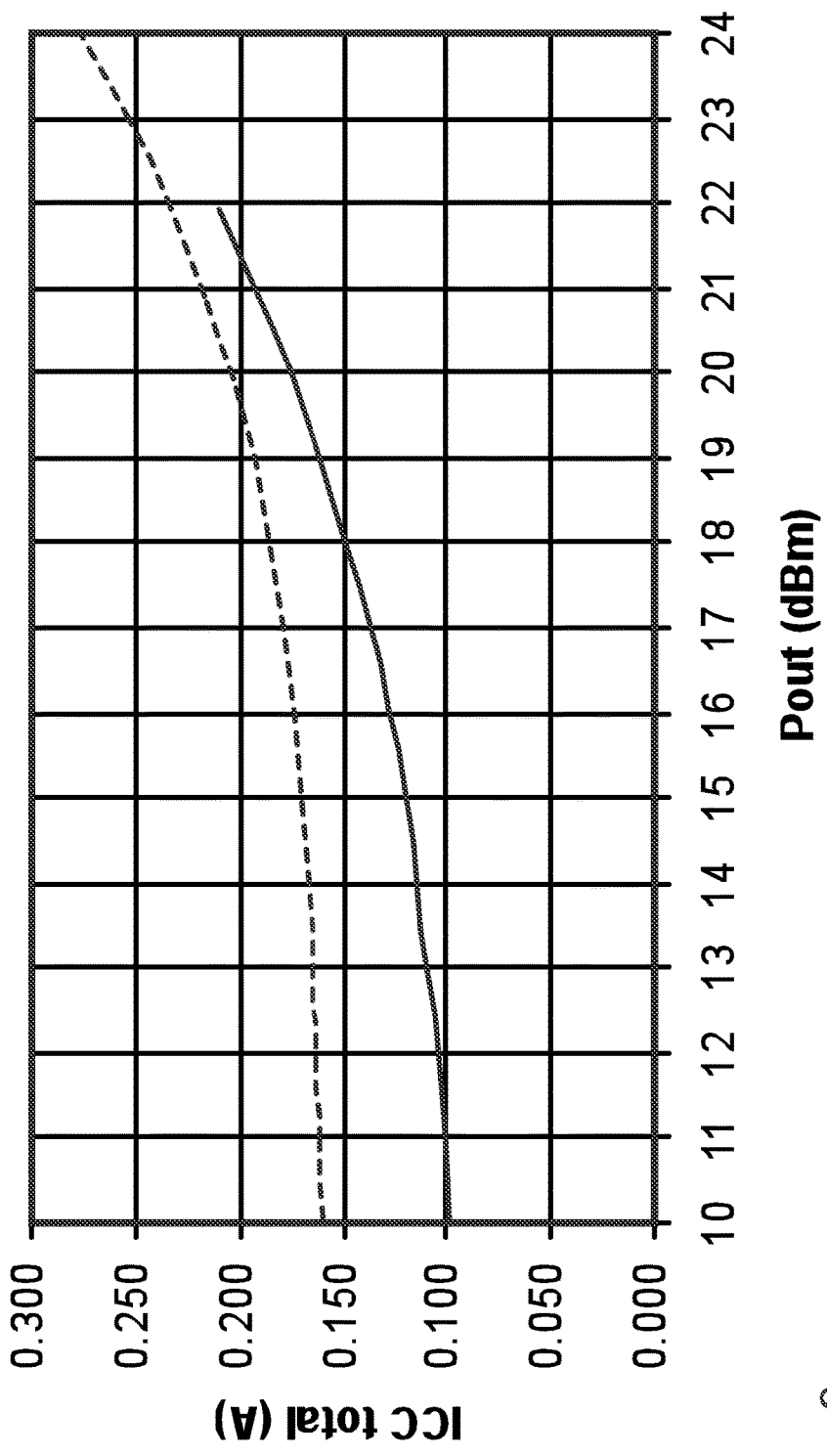
FIG. 9 is a graphical representation of Current Drain increase for Optimum OOB.

As can be seen in FIGS. 7, 8, and 9, increasing PA bias current greatly improves Band Edge performance (or Out Of Band—OOB) for 802.11b and 802.11g Band Edge performance. In FIG. 7, the performance improvement with the lower bias current is evident. Here, not only is the specified limit crossed at a higher power level, the OOB is lower and more consistent across the entire range where the higher bias current operation is within the specified limit. This allows for increased amplification when desired. From these plots it is evident that the transmit power can be increased up to 3 dB for 802.11b and 1.5 dB for 802.11g signals at the band edge channels by appropriately adjusting the power amplifier bias.

Figure 10:
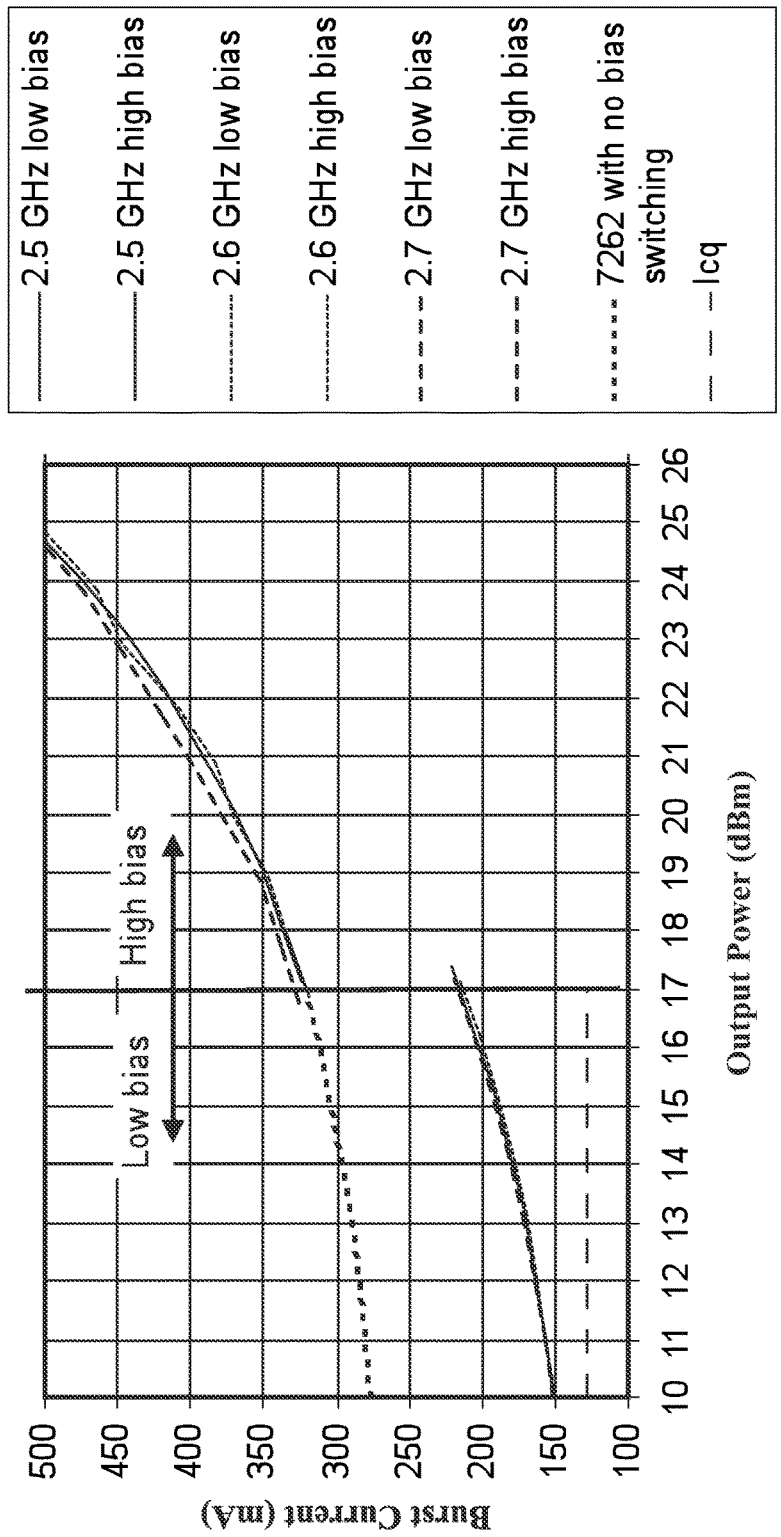
FIG. 10 is a graphical representation of burst current vs. output power.
Figure 11:
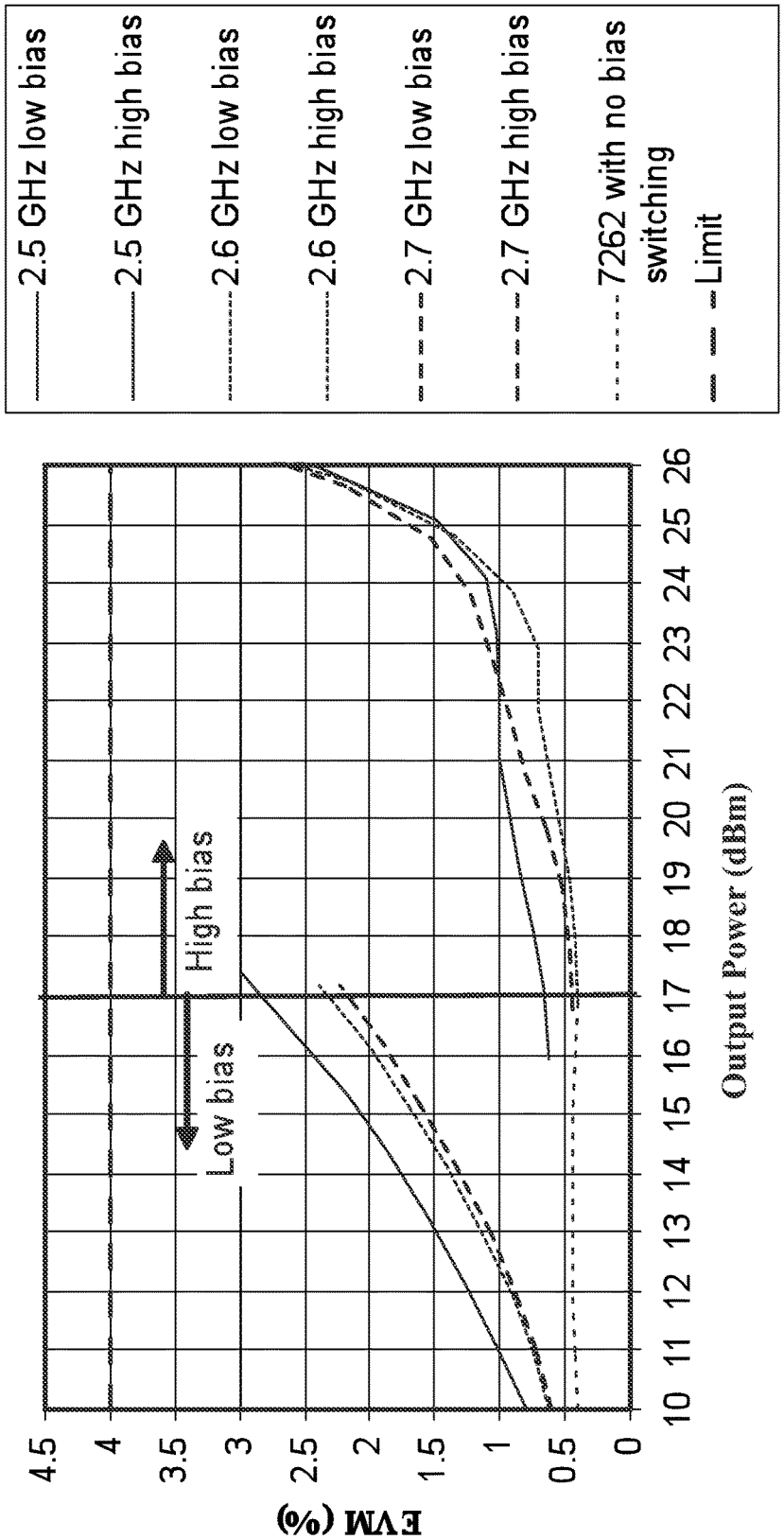
FIG. 11 is a graphical representation of EVM vs. output power.

In an alternative embodiment, a bias of the PA is adjusted in a discrete stepwise fashion. Referring to FIG. 10, an impact of using only 2 bias points with a single transition is shown. Icq is reduced from 250 mA to 128 mA, and power consumption is reduced. This provides some of the benefits outlined hereinabove but with a much simpler implementation. For example, 2-step control could be implemented using a separate control pin. Alternatively, a serial interface is used allowing reduced complexity as the number of bias points is increased. As shown in FIG. 11, EVM remains below 3% over the entire power range and the single bias change improves efficiency within one of the two ranges. In the example shown, there is a step discontinuity in EVM at 17 dBm. Of course, the switch point could be lowered if EVM<2% is required at backed-off powers.

Alternatively, more than two bias points are used.

In another alternative embodiment, a fixed bias point is used over one or more ranges while a variable bias point is used over one or more other ranges. Thus, the benefits of the simplicity of the embodiment of FIGS. 10 and 11 are achieved with the improved EVM behavior of the first embodiment over the ranges specified.

Figure 12A:
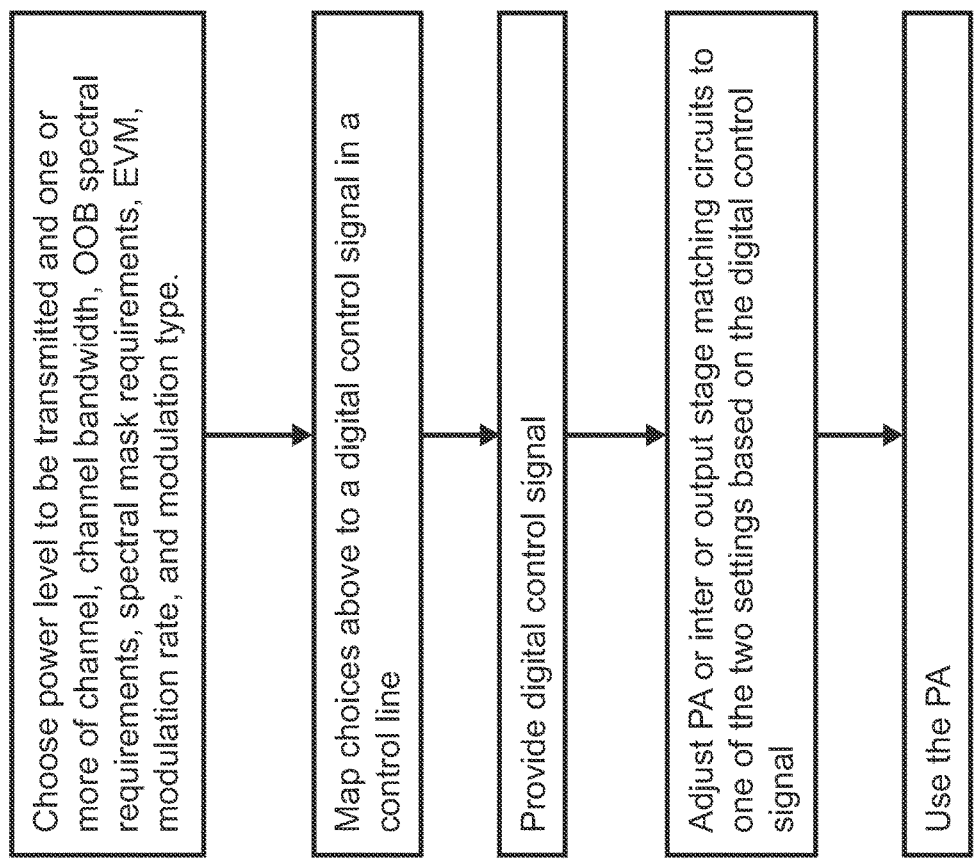
FIG. 12a is a simplified flow diagram of a method relying on a discrete number of biasing states for the amplifier.
Figure 12B:
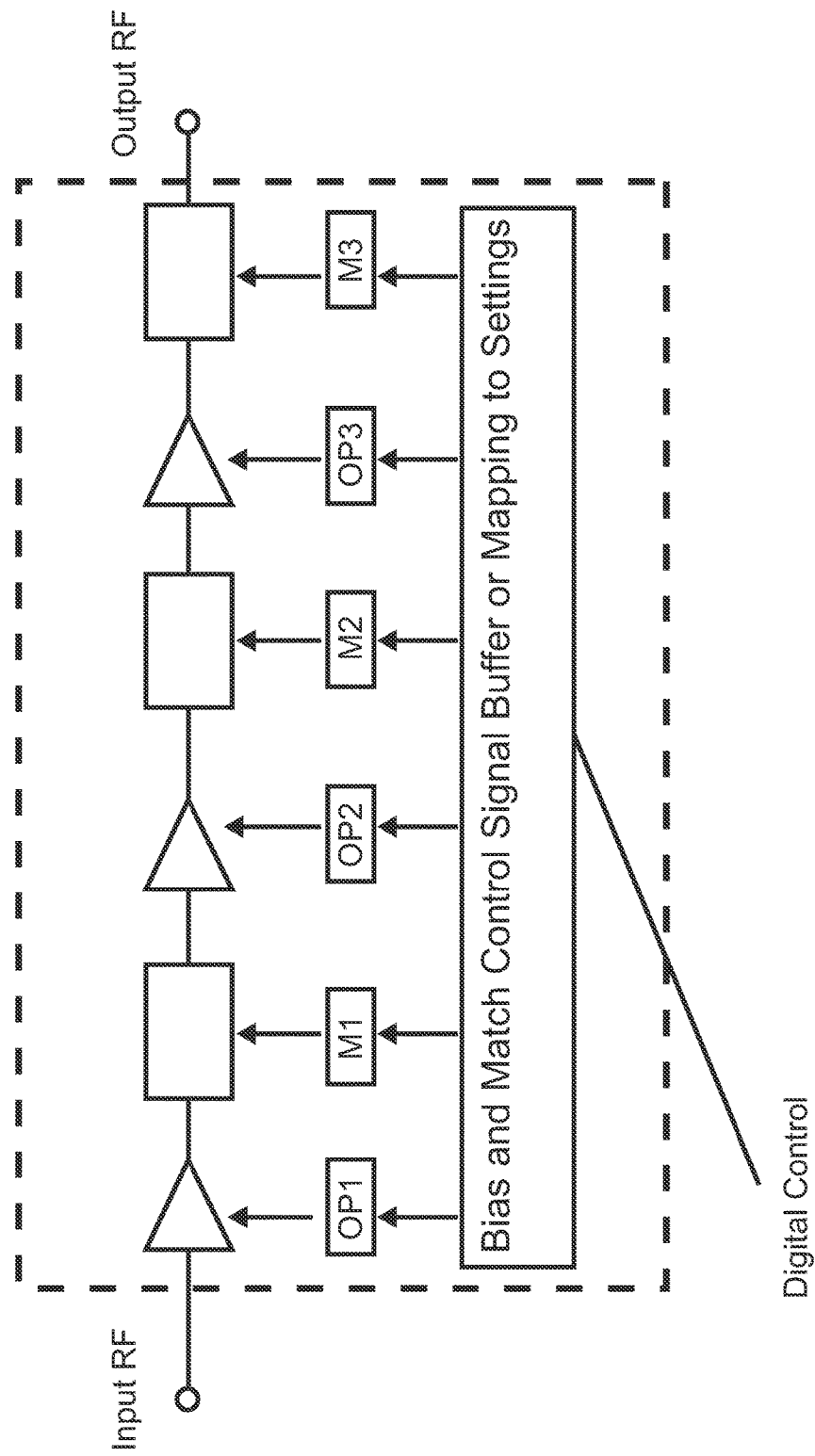

Referring to FIG. 12a, a method is shown wherein a control signal is received for selectively switching the amplifier between a first biasing mode of operation with reduced current and a second other biasing mode of operation with higher bias current. For example, the control signal is provided at a pin wherein a "0" indicates low bias current and a "1" indicates higher bias current. Alternatively, the signal is provided within a digital control signal comprising other control values. Referring to FIG. 12b, an amplifier circuit is shown for use with the method of FIG. 12a.

Advantageously, using CMOS technology within a SiGe BiCMOS technology allows for digital control of an amplifier according to embodiments of the present invention. The use of a digital control and interface for a control signal presents several advantages. Firstly, the control signal optionally comprises a digital selection of two or more amplifier configurations. For example, those shown in FIG. 12a. Using a digital control signal is advantageous as it allows N different amplifier configurations to be selectable without requiring numerous input ports or pins. Secondly, it allows for the amplifier to select an amplifier configuration based on data provided in a simple form which can, with little further processing, be used in the configuration of the amplifier. For example, the control signal comprises an indication of a standard, a channel, a modulation type and rate, etc. and the amplifier integrated circuit comprises logic for mapping those values onto a lookup table to determine a configuration. Alternatively, the values are processed to determine a configuration of the amplifier supporting continuous variation of biasing and/or matching circuits. Of course, it is also supported that a lookup table establishes the processing to be performed in order to support continuous variation of biasing and/or matching circuits.

Within the amplifier, bias is controllable. Also within the amplifier, filters can be designed in a fashion to provide controllability. These tunable filters are useful in that better filtering—higher rejection—usually has an associated higher insertion loss. As such, an ability to tune a filter to reduce rejection would also advantageously reduce insertion loss. Filter tuning is useful in improving efficiency in some applications.

In some embodiments, digital control, which supports separate control over each tunable aspect of an amplifier, is provided. This optionally includes each stage of the amplifier as well. As such, bias is controllable for each amplifier stage and filters are tunable independently for each amplification stage. By providing independent control, a control that results in an approximately most efficient operation of the amplifier is selectable. This also adds significant flexibility in the event of new standards and new modulation techniques.

Optionally only some of the stages are independently controllable. Further optionally, each stage receives a same control signal.

In an alternative embodiment, the matching circuits are controlled instead of the bias current in order to achieve similar benefits. In yet another embodiment, the bias current and matching circuits are controlled. For example, the bias point of the PA is adjusted and then the matching circuit is adjusted to account for any changes in the PA load line. Of course, as will be evident to those of skill in the art, other methods of achieving control over biasing of the PA and/or control over the matching circuits are also applicable to embodiments of the invention.

Though the invention has been described with reference to a set of potential variables for use in tuning of the amplifier, anyone or more of those variables is independently useful for amplifier control or useful in conjunction with one or more other variables. For example, channel bandwidth is useful in isolation or with modulation type, for example. Similarly, each is useful with more than one other variable or in isolation.

Numerous other embodiments may be envisaged without departing from the scope of the invention.

What is claimed is:

1. An amplifier circuit comprising a control circuit configured to determine a bias current for an amplifying transistor based at least in part on an operating channel, the amplifying transistor configured to operate in a multi-channel system, the bias current for the amplifying transistor operating at channels at an edge of a channel band being different from the bias current for the amplifying transistor operating at channels nearer a center of the channel band.

2. The amplifier circuit of claim 1 wherein the control circuit is further configured to provide the bias current to the amplifying transistor through a control signal.

3. The amplifier circuit of claim 2 wherein the control signal includes a digital control signal.

4. The amplifier circuit of claim 2 wherein the control signal is determined to improve an operation efficiency of a mobile device including the amplifier circuit.

5. The amplifier circuit of claim 1 further comprising a matching circuit configured to provide impedance matching between an output port of the amplifying transistor and a load.

6. The amplifier circuit of claim 5 wherein the control circuit is further configured to determine matching characteristics of the matching circuit, the matching characteristics based at least in part on a transmission power level from the amplifying transistor and an indication of amplifier circuit operation.

7. The amplifier circuit of claim 6 wherein the matching characteristics of the matching circuit are different for the channels at the edge of the channel band than for the channels nearer the center of the channel band.

8. The amplifier circuit of claim 6 wherein the indication of amplifier operation includes an error vector magnitude target, an operating point, and the operating channel of the amplifier circuit.

9. The amplifier circuit of claim 1 wherein the control circuit is further configured to determine the bias current for the amplifying transistor based at least in part on an error vector magnitude target and an operating point.

10. A method to determine bias current based at least in part on an operating channel, the method comprising:
    determining a first bias current for an amplifying transistor when the amplifying transistor is operating at channels at an edge of a channel band, the amplifying transistor configured to operate in a multi-channel system; and
    determining a second bias current for the amplifying transistor when the amplifying transistor is operating at channels nearer a center of the channel band, the second bias current different from the first bias current.

11. The method of claim 10 further comprising providing impedance matching between an output port of the amplifying transistor and a load.

12. The method of claim 10 further comprising determining matching characteristics of a matching circuit, the matching characteristics based at least in part on a transmission power level from the amplifying transistor and an indication of amplifier circuit operation.

13. The method of claim 12 wherein the matching characteristics of the matching circuit are different for the channels at the edge of the channel band than for the channels nearer the center of the channel band.

14. The method of claim 12 wherein the indication of amplifier operation includes an error vector magnitude target, an operating point, and the operating channel of the amplifier circuit.

15. A wireless communication device comprising:
    an antenna configured to transmit an amplified radio frequency output signal; and
    an amplifier circuit configured receive a radio frequency input signal and to amplify the radio frequency input signal to provide the amplified radio frequency output signal, the amplifier circuit including a control circuit configured to determine a bias current for an amplifying transistor based at least in part on an operating channel, the amplifying transistor configured to operate in a multi-channel system, the bias current for the amplifying transistor operating at channels at an edge of a channel band being different from the bias current for the amplifying transistor operating at channels nearer a center of the channel band.

16. The wireless communication device of claim 15 wherein the control circuit is further configured to provide the bias current to the amplifying transistor through a control signal.

17. The wireless communication device of claim 15 wherein the amplifier circuit further includes a matching circuit configured to provide impedance matching between an output port of the amplifying transistor and a load.

18. The wireless communication device of claim 17 wherein the control circuit is further configured to determine matching characteristics of the matching circuit, the matching characteristics based at least in part on a transmission power level from the amplifying transistor and an indication of amplifier circuit operation.

19. The wireless communication device of claim 18 wherein the matching characteristics of the matching circuit are different for the channels at the edge of the channel band than for the channels nearer the center of the channel band.

20. The wireless communication device of claim 18 wherein the indication of amplifier operation includes an error vector magnitude target, an operating point, and the operating channel of the amplifier circuit.

* * * * *

UNITED STATES PATENT AND TRADEMARK OFFICE
CERTIFICATE OF CORRECTION

PATENT NO. : 10,128,807 B2
APPLICATION NO. : 15/423911
DATED : November 13, 2018
INVENTOR(S) : Trainor et al.

Page 1 of 1

It is certified that error appears in the above-identified patent and that said Letters Patent is hereby corrected as shown below:

In the Specification

In Column 3, Line 23, change "1 0dBm" to --10 dBm--.

In Column 3, Line 49, change "1.8," to --1.8 V,--.

In Column 3, Line 49, change "I.2V" to --1.2 V--.

In Column 7, Line 51, change "EVM" to --EVM.--.

In Column 8, Line 38, change "off"" to --off"--.

In the Claims

In Column 12, Line 14 (Approx.), Claim 15, change "configured" to --configured to--.

Signed and Sealed this
Fifth Day of March, 2019

Andrei Iancu
*Director of the United States Patent and Trademark Office*